United States Patent
Horiuchi

(10) Patent No.: US 10,564,887 B2
(45) Date of Patent: Feb. 18, 2020

(54) CONTROL DEVICE AND DATA WRITING METHOD THEREOF

(71) Applicant: FANUC CORPORATION, Yamanashi (JP)

(72) Inventor: Reiko Horiuchi, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/366,052

(22) Filed: Mar. 27, 2019

(65) Prior Publication Data
US 2019/0303036 A1 Oct. 3, 2019

(30) Foreign Application Priority Data
Mar. 29, 2018 (JP) ................................. 2018-063801

(51) Int. Cl.
*G06F 3/06* (2006.01)
*G11C 11/409* (2006.01)

(52) U.S. Cl.
CPC .......... *G06F 3/0653* (2013.01); *G06F 3/0619* (2013.01); *G06F 3/0658* (2013.01); *G06F 3/0679* (2013.01); *G11C 11/409* (2013.01)

(58) Field of Classification Search
CPC .... G06F 3/0653; G06F 3/0679; G06F 3/0658; G11C 11/409
See application file for complete search history.

(56) References Cited

U.S. PATENT DOCUMENTS 6,084,813 A * 7/2000 Kikuchi .............. G11C 11/4074
365/222
7,885,133 B2 * 2/2011 Murakami ............ G06F 1/3203
365/222
(Continued)

FOREIGN PATENT DOCUMENTS

JP 201181659 A 4/2011
JP 201560412 A 3/2015

OTHER PUBLICATIONS

English Abstract and Machine Translation for Japanese Publication No. 2015-060412 A, published Mar. 30, 2015, 11 pgs.
(Continued)

*Primary Examiner* — Henry Tsai
*Assistant Examiner* — Christopher Daley
(74) *Attorney, Agent, or Firm* — Fredrikson & Byron, P.A.

(57) ABSTRACT

A control device includes: a memory controller configured to output a control signal to a nonvolatile memory in response to a write request from a processor; a voltage monitoring portion configured to monitor an input voltage supplied from an input power supply; a mask signal generating portion configured to generate and output a mask signal when the voltage monitoring portion determines that the input voltage has decreased; and a masking portion configured to apply, when receiving the mask signal outputted from the mask signal generating portion, a masking processing to the control signal outputted from the memory controller to the nonvolatile memory. When the voltage monitoring portion determines that the input voltage has decreased, and the data is being written to the nonvolatile memory, then the mask signal generating portion outputs the mask signal after the completion of the data writing.

8 Claims, 3 Drawing Sheets

(56) References Cited

U.S. PATENT DOCUMENTS

| | | | |
|---|---|---|---|
| 8,090,988 B2* | 1/2012 | Hoang | G06F 1/30 |
| | | | 714/22 |
| 2010/0226170 A1* | 9/2010 | Lin | G11C 5/141 |
| | | | 365/185.03 |
| 2017/0062041 A1* | 3/2017 | Kataoka | G06F 13/1694 |

OTHER PUBLICATIONS

English Abstract and Machine Translation for Japanese Publication No. 2011-081659 A, published Apr. 21, 2011, 17 pgs.

* cited by examiner

CONTROL DEVICE AND DATA WRITING METHOD THEREOF

CROSS-REFERENCE TO RELATED APPLICATION

This application is based upon and claims the benefit of priority from Japanese Patent Application No. 2018-063801 filed on Mar. 29, 2018, the contents of which are incorporated herein by reference.

BACKGROUND OF THE INVENTION

Field of the Invention

The present invention relates to a control device having a processor and a nonvolatile memory and a data writing method thereof.

Description of the Related Art

If the power supply becomes off while data is being written to a nonvolatile memory in response to a write request from a processor, the data being written is lost and data stored in the nonvolatile memory may also be damaged. For the purpose of preventing such damaging of data, Japanese Laid-Open Patent Publication No. 2011-081659 proposes a storage device, for example.

The storage device of Japanese Laid-Open Patent Publication No. 2011-081659 includes a nonvolatile memory, an access control portion for controlling the nonvolatile memory, and a sending/receiving portion for sending and receiving data to and from a host device. In this storage device, when an abnormality of the power supply to the storage device is detected, the supply of system clock to the sending/receiving portion is stopped so that the storage device halts. This places the storage device in a state where it does not accept a write request from the host device.

SUMMARY OF THE INVENTION

There is a demand to protect data stored in a nonvolatile memory while accepting a write request from a host device.

Accordingly, an object of the present invention is to provide a control device capable of protecting data stored in a nonvolatile memory while accepting a write request, and a data writing method thereof.

According to a first aspect of the present invention, a control device including a processor and a nonvolatile memory includes: a memory controller configured to output, to the nonvolatile memory, a control signal for storing data to the nonvolatile memory, in response to a write request from the processor; a voltage monitoring portion configured to monitor an input voltage supplied from an input power supply; a mask signal generating portion configured to generate and output a mask signal when the voltage monitoring portion determines that the input voltage has decreased; and a masking portion configured to apply, when receiving the mask signal outputted from the mask signal generating portion, a masking processing to the control signal outputted from the memory controller to the nonvolatile memory, wherein, when the voltage monitoring portion determines that the input voltage has decreased, and the data is being written to the nonvolatile memory, then the mask signal generating portion outputs the mask signal after the completion of the data writing.

According to a second aspect of the present invention, a data writing method of a control device including a processor and a nonvolatile memory, includes: an output step of outputting to the nonvolatile memory a control signal for storing data to the nonvolatile memory in response to a write request from the processor; a monitoring step of monitoring an input voltage supplied from an input power supply; and a masking step of applying a masking processing to the control signal outputted to the nonvolatile memory, when the monitoring step determines that the input voltage has decreased, wherein, when the monitoring step determines that the input voltage has decreased, and the data is being written to the nonvolatile memory, then the masking step applies the masking processing after the completion of the data writing.

According to the present invention, it is possible to protect data stored in the nonvolatile memory while accepting a write request.

The above and other objects, features, and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

The control device and data writing method thereof according to the present invention will be described in detail below in conjunction with preferred embodiments with reference to the accompanying drawings.

[Embodiment]

Figure 1:
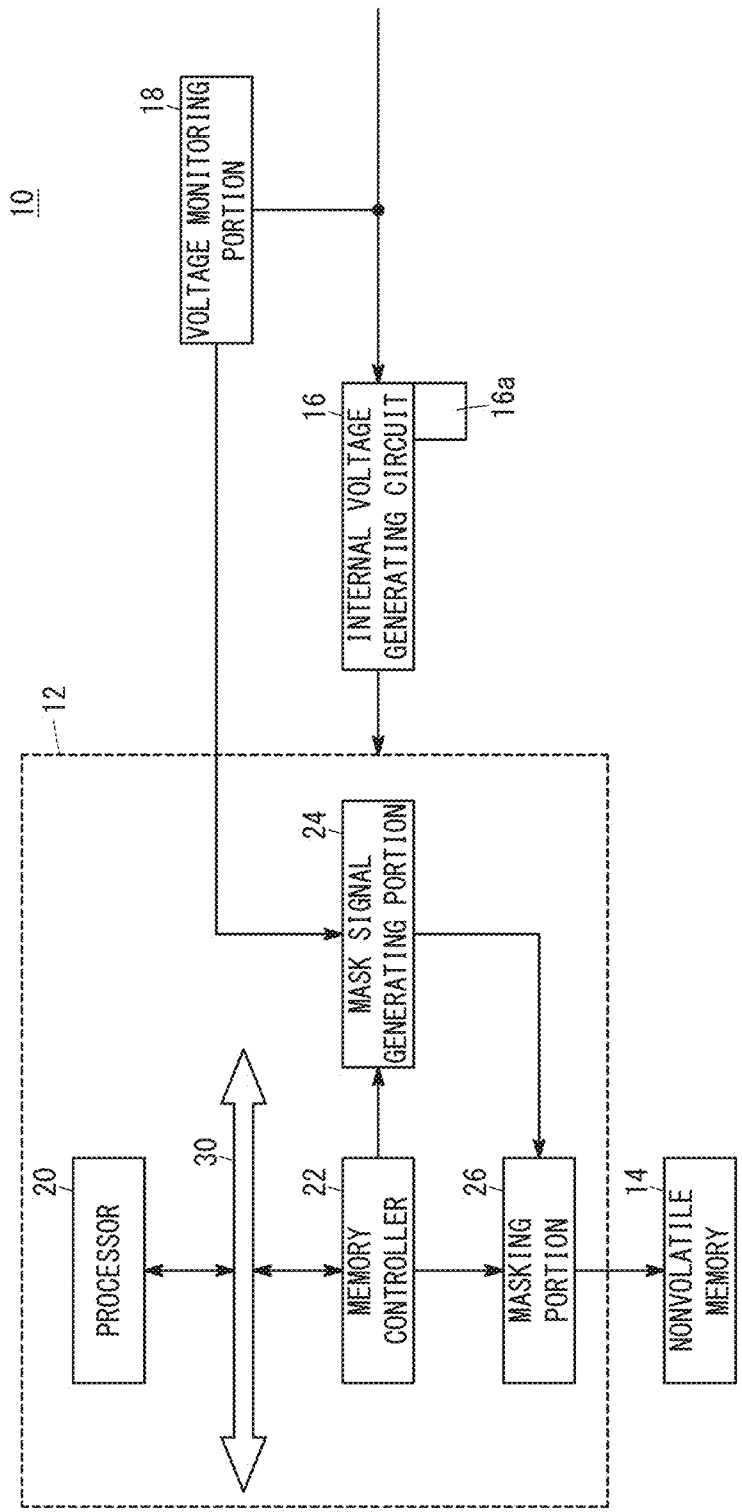
FIG. 1 is a block diagram showing a control device according to an embodiment.

FIG. 1 is a block diagram showing a control device 10. The control device 10 is, for example, a numerical control device for use with a machine tool or industrial robot. The control device 10 mainly includes a signal processing portion 12, a nonvolatile memory 14, an internal voltage generating circuit 16, and a voltage monitoring portion 18.

The signal processing portion 12 generates a control signal for causing the nonvolatile memory 14 to store data, and outputs the generated control signal to the nonvolatile memory 14. The signal processing portion 12 operates with an internal voltage supplied from the internal voltage generating circuit 16.

The nonvolatile memory 14 is a memory that retains stored contents even when not supplied with power. The nonvolatile memory 14 writes data based on the control signal supplied from the signal processing portion 12.

The internal voltage generating circuit 16 generates the internal voltage for causing the signal processing portion 12 to operate, based on an input voltage supplied from an input power supply not shown, and supplies the generated internal voltage to the signal processing portion 12.

The internal voltage generating circuit 16 includes an accumulation portion 16a configured to accumulate the internal voltage, where the internal voltage is accumulated at the accumulation portion 16a as the accumulation portion 16a is charged by the input voltage. When the input voltage from the input power supply is cut off, the internal voltage generating circuit 16 supplies the internal voltage accumulated at the accumulation portion 16a to the signal processing portion 12. The accumulation portion 16a can be, for example, a capacitor, battery, or the like.

The voltage monitoring portion 18 monitors the input voltage supplied from the input power supply, and provides an abnormality signal to the signal processing portion 12 when the voltage monitoring portion 18 decides that the input voltage has decreased. That is, when the input voltage supplied from the input power supply has fallen below a given threshold, the voltage monitoring portion 18 generates the abnormality signal by deciding that the input voltage has decreased, and provides the generated abnormality signal to the signal processing portion 12. Thus, the voltage monitoring portion 18 can detect cutoff of the input voltage supplied from the input power supply and signal the detected result to the signal processing portion 12.

Next, the signal processing portion 12 will be described more specifically. The signal processing portion 12 includes a processor 20, a memory controller 22, a mask signal generating portion 24, and a masking portion 26. Various devices, such as the memory controller 22, an input/output device, etc., are connected to the processor 20 through a bus 30.

The processor 20 is configured to control various devices through the bus 30 and provides a write request to the memory controller 22 through the bus 30 when causing the nonvolatile memory 14 to write data therein.

In response to the write request from the processor 20, the memory controller 22 outputs the control signal to the nonvolatile memory 14. That is, when receiving the write request from the processor 20, the memory controller 22 generates the control signal for causing the nonvolatile memory 14 to store the data that is specified by that write request, and outputs the generated control signal to the nonvolatile memory 14.

Further, the memory controller 22 generates status information indicating whether the data specified by the write request is currently being written, and outputs the generated status information to the mask signal generating portion 24.

When the sequence of storing the data specified by the write request from the processor 20 into the nonvolatile memory 14 has been completed, the memory controller 22 outputs a response signal to the processor 20 as a response to that write request.

The mask signal generating portion 24 is configured to generate and output a mask signal for notifying that masking processing is needed, when the voltage monitoring portion 18 has decided that the input voltage decreased.

That is, on receiving the abnormality signal from the voltage monitoring portion 18, the mask signal generating portion 24 generates the mask signal from the time when receiving the abnormality signal. Also, from the time when receiving the abnormality signal, the mask signal generating portion 24 recognizes whether the data is being written to the nonvolatile memory 14, based on the status information outputted from the memory controller 22.

Then, when data is not being written to the nonvolatile memory 14, the mask signal generating portion 24 outputs the generated mask signal to the masking portion 26. On the other hand, when data is being written to the nonvolatile memory 14, the mask signal generating portion 24 outputs the generated mask signal to the masking portion 26 after the data writing has been completed.

When receiving the mask signal outputted from the mask signal generating portion 24, the masking portion 26 applies masking processing to the control signal outputted from the memory controller 22 to the nonvolatile memory 14. That is, the masking portion 26 invalidates the control signal outputted from the memory controller 22 so that the nonvolatile memory 14 does not perform writing operation.

Figure 2:
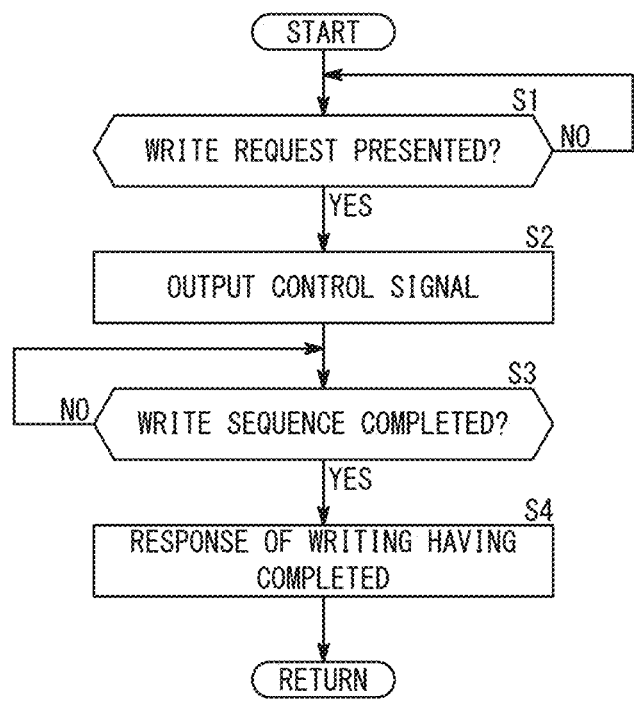
FIG. 2 is a flowchart illustrating a procedure of memory control processing.

Next, a method by which the control device 10 writes data will be described dividing the method into memory control processing and masking processing. FIG. 2 is a flowchart showing a procedure of the memory control processing.

The memory controller 22 proceeds to step S1 every time a certain time elapses. At step S1, the memory controller 22 determines whether a write request has been presented from the processor 20. When no write request is presented from the processor 20, the memory controller 22 returns to step S1.

On the other hand, when a write request has been presented from the processor 20, the memory controller 22 proceeds to step S2. At step S2, the memory controller 22 generates the control signal for storing the data specified by the write request to the nonvolatile memory 14, outputs the generated control signal to the nonvolatile memory 14, and then proceeds to step S3.

At step S3, the memory controller 22 determines whether the sequence of storing into the nonvolatile memory 14 the data specified by the write request from the processor 20 has been completed. When determining that the sequence has not been completed, the memory controller 22 returns to step S3 whereas when determining that the sequence has been completed, the memory controller 22 proceeds to step S4.

At step S4, the memory controller 22 responds to the write request by generating a response signal and outputting the response signal to the processor 20, and then returns to step S1.

In this way, the memory controller 22 determines the presence/absence of a write request from the processor 20 at certain time intervals. If a write request is present, the memory controller 22 responds to that write request after executing the sequence of writing the data specified by the write request.

Figure 3:
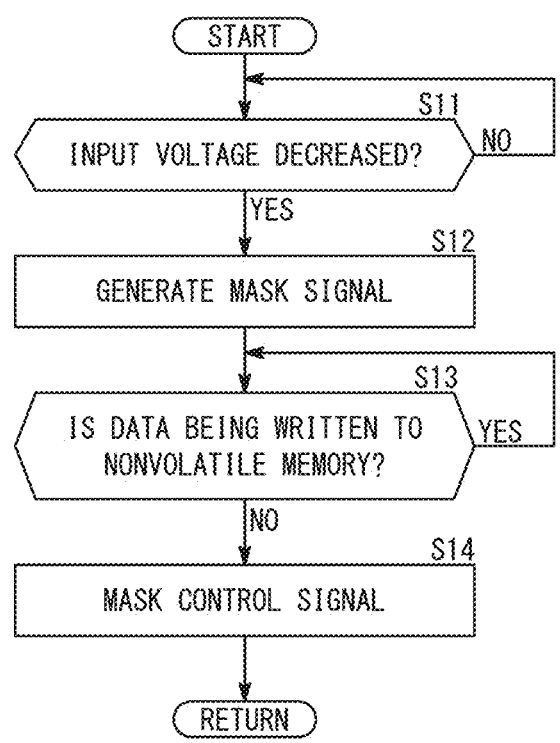
FIG. 3 is a flowchart illustrating a procedure of masking processing.

FIG. 3 is a flowchart illustrating a procedure of the masking processing. As a premise for performing this masking processing procedure, it is assumed that the internal voltage generating circuit 16 has generated the internal voltage based on the input voltage supplied from the input power supply and outputted the internal voltage to the signal processing portion 12, and that the internal voltage generating circuit 16 has accumulated the internal voltage at the accumulation portion 16a.

At step S11, the voltage monitoring portion 18 monitors the input voltage supplied from the input power supply and determines whether the input voltage has decreased. When the input voltage has not fallen below a given threshold, the voltage monitoring portion 18 determines that the input voltage has not decreased and returns to step S11.

On the other hand, when the input voltage falls below the given threshold, the voltage monitoring portion 18 determines that the input voltage has decreased and proceeds to step S12. At step S12, the mask signal generating portion 24 generates the mask signal and proceeds to step S13. At step S13, the mask signal generating portion 24 recognizes whether data is being written to the nonvolatile memory 14, based on the status information supplied from the memory controller 22.

If data is not being written into the nonvolatile memory 14, the mask signal generating portion 24 proceeds to step S14. On the other hand, if data is being written to the nonvolatile memory 14, the mask signal generating portion 24 waits until the data writing has been completed, and proceeds to step S14 after the completion of writing.

At step S14, the mask signal generating portion 24 outputs the mask signal generated at step S12 to the masking portion 26. Receiving the mask signal, the masking portion 26 applies masking processing to the control signal outputted from the memory controller 22 to the nonvolatile memory 14. The masking processing procedure thus ends.

As described so far, when the input voltage has decreased below a certain value, the control device 10 determines whether data is being written to the nonvolatile memory 14. When data is being written, the masking processing is performed after the data writing has been completed.

That is, in the control device 10, data being written at the time when the input voltage is cut off is allowed to continue being written in. On the other hand, in the control device 10, the memory controller 22 accepts a new write request that is provided from the processor 20 after the input voltage has been cut off, but the control signal for storing the data specified by that write request to the nonvolatile memory 14 is masked. In this way, it is possible to protect data stored in the nonvolatile memory 14 without, at the memory controller 22, rejecting the write request from the processor 20.

When accepting a new write request, the memory controller 22 outputs, as has been illustrated referring to FIG. 2, a completion signal to the processor 20 as a response to that write request, in the same manner as the normal case where the input voltage is not decreased.

Thus it is possible to avoid loss of the time that the processer 20 requires to process the response to a new write request, and to avoid hang-up and unnecessary occupation of the bus 30.

[Modifications]

The embodiment has been described above as an example of the present invention, and the technical scope of the present invention is not limited to the scope described in the embodiment above. Various modifications or improvements can of course be added to the above-described embodiment. It is clear from the recitation of claims that embodiments thus modified or improved are included in the technical scope of the present invention.

For example, in the above-described embodiment, when the voltage monitoring portion 18 determines that the input voltage has decreased, the mask signal generating portion 24 generates the mask signal before determining whether data is being written to the nonvolatile memory 14. However, the mask signal generating portion 24 may be configured to generate the mask signal after determining whether data is being written to the nonvolatile memory 14.

Further, in the above-described embodiment, the voltage monitoring portion 18 does not operate with the internal voltage generated by the internal voltage generating circuit 16, but it may be configured to operate with the internal voltage.

Further, in the above-described embodiment, the control device 10 is a numerical control device for use with a machine tool or industrial robot, but the control device 10 may be a control device configured to control equipment other than a machine tool or industrial robot.

[Technical Ideas]

Technical ideas that can be grasped from the above-described embodiment and modifications will be described below.

(First Technical Idea)

A control device (10) includes a processor (20) and a nonvolatile memory (14). The control device (10) includes: a memory controller (22) configured to output, to the nonvolatile memory (14), a control signal for storing data to the nonvolatile memory (14), in response to a write request from the processor (20); a voltage monitoring portion (18) configured to monitor an input voltage supplied from an input power supply; a mask signal generating portion (24) configured to generate and output a mask signal when the voltage monitoring portion (18) determines that the input voltage has decreased; and a masking portion (26) configured to apply, when receiving the mask signal outputted from the mask signal generating portion (24), a masking processing to the control signal outputted from the memory controller (22) to the nonvolatile memory (14).

When the voltage monitoring portion (18) determines that the input voltage has decreased, and the data is being written to the nonvolatile memory (14), then the mask signal generating portion (24) outputs the mask signal after the completion of the data writing.

The control device (10) is thus capable of protecting data stored in the nonvolatile memory (14) while accepting a write request from the processor (20).

The memory controller (22) may be configured to output to the mask signal generating portion (24), status information that indicates whether the data is being written to the nonvolatile memory (14). Then, the mask signal generating portion (24) can output the mask signal after the completion of the data writing to the nonvolatile memory (14), based on the status information from the memory controller (22).

The control device (10) may further include an internal voltage generating circuit (16) configured to generate an internal voltage from the input voltage, and at least the processor (20), the memory controller (22), the mask signal generating portion (24), and the masking portion (26) may be configured to operate with the internal voltage. This makes it easier to have the processor (20), memory controller (22), mask signal generating portion (24), and masking portion (26), stably operate even if the input voltage varies.

The internal voltage generating circuit (16) may include an accumulation portion (16a) configured to accumulate the internal voltage. It is then possible, even if the input voltage is cut off from the input power supply, to have the processor (20), memory controller (22), mask signal generating portion (24), and masking portion (26) operate by using the internal voltage accumulated at the accumulation portion (16a).

(Second Technical Idea)

A data writing method is a data writing method of a control device (10) including a processor (20) and a nonvolatile memory (14). The data writing method includes: an output step (S2) of outputting to the nonvolatile memory (14), a control signal for storing data to the nonvolatile memory (14) in response to a write request from the processor (20); a monitoring step (S12) of monitoring an input voltage supplied from an input power supply; and a masking step (S14) of applying a masking processing to the control signal outputted to the nonvolatile memory (14) when the monitoring step (S12) determines that the input voltage has decreased.

When the monitoring step (S12) determines that the input voltage has decreased, and the data is being written to the nonvolatile memory (14), then the masking step (S14) applies the masking processing after the completion of the data writing.

It is thus possible to protect data stored in the nonvolatile memory (14) while accepting a write request from the processor (20).

Whether the data is being written to the nonvolatile memory (14) may be determined based on status information indicating whether data is being written to the nonvolatile memory (14).

The data writing method may further include a generating step of generating an internal voltage from the input voltage, and at least the processor (20), a memory controller (22) configured to output the control signal, a masking portion (26) configured to apply the masking processing, and a mask signal generating portion (24) configured to generate a mask signal for causing the masking portion (26) to apply the masking processing, may be configured to operate with the internal voltage generated at the generating step. This makes it easier to have the processor (20), memory controller (22), mask signal generating portion (24), and masking portion (26), stably operate even if the input voltage varies.

The generating step may accumulate the internal voltage at an accumulation portion (16*a*). It is then possible even if the input voltage is cut off from the input power supply, to make the processor (20), memory controller (22), mask signal generating portion (24), and masking portion (26), operate by using the internal voltage accumulated at the accumulation portion (16*a*).

What is claimed is:

1. A control device including a processor and a nonvolatile memory, the control device comprising:
a memory controller configured to output, to the nonvolatile memory, a control signal for storing data to the nonvolatile memory, in response to a write request from the processor;
a voltage monitoring portion configured to monitor an input voltage supplied from an input power supply;
a mask signal generating portion configured to generate and output a mask signal when the voltage monitoring portion determines that the input voltage has decreased wherein the mask signal invalidates the control signal output from the memory controller so that the nonvolatile memory does not perform a writing operation; and
a masking portion configured to apply, when receiving the mask signal outputted from the mask signal generating portion, a masking processing to the control signal outputted from the memory controller to the nonvolatile memory,
wherein, when the voltage monitoring portion determines that the input voltage has decreased, and the data is being written to the nonvolatile memory, then the mask signal generating portion outputs the mask signal only after completion of the data writing.

2. The control device according to claim 1, wherein the memory controller is configured to output to the mask signal generating portion status information that indicates whether the data is being written to the nonvolatile memory.

3. The control device according to claim 1, further comprising an internal voltage generating circuit configured to generate an internal voltage from the input voltage,
wherein at least the processor, the memory controller, the mask signal generating portion, and the masking portion, are configured to operate with the internal voltage.

4. The control device according to claim 3, wherein the internal voltage generating circuit includes an accumulation portion configured to accumulate the internal voltage.

5. A data writing method of a control device including a processor and a nonvolatile memory, the method comprising:
an output step of outputting to the nonvolatile memory a control signal for storing data to the nonvolatile memory in response to a write request from the processor;
a monitoring step of monitoring an input voltage supplied from an input power supply; and
a masking step of applying a masking processing to the control signal outputted to the nonvolatile memory when the monitoring step determines that the input voltage has decreased,
wherein, when the monitoring step determines that the input voltage has decreased, and the data is being written to the nonvolatile memory, then the masking step applies the masking processing after completion of the data writing.

6. The data writing method according to claim 5, wherein whether the data is being written to the nonvolatile memory is determined based on status information indicating whether the data is being written to the nonvolatile memory.

7. The data writing method according to claim 5, further comprising a generating step of generating an internal voltage from the input voltage,
wherein at least the processor, a memory controller configured to output the control signal, a masking portion configured to apply the masking processing, and a mask signal generating portion configured to generate a mask signal for causing the masking portion to apply the masking processing, are configured to operate with the internal voltage generated at the generating step.

8. The data writing method according to claim 7, wherein the generating step accumulates the internal voltage at an accumulation portion.

* * * * *